(12) United States Patent
Lin

(10) Patent No.: US 6,794,947 B2
(45) Date of Patent: Sep. 21, 2004

(54) METHOD FOR ADJUSTING OSCILLATOR FREQUENCIES

(75) Inventor: Tsung-Shien Lin, Taoyuan Hsien (TW)

(73) Assignee: Delta Electronics Inc., Taoyuan Sien (TW)

( * ) Notice: Subject to any disclaimer, the term of this patent is extended or adjusted under 35 U.S.C. 154(b) by 66 days.

(21) Appl. No.: 10/160,042

(22) Filed: Jun. 4, 2002

(65) Prior Publication Data

US 2002/0190801 A1 Dec. 19, 2002

(30) Foreign Application Priority Data

Jun. 18, 2001 (TW) ........................................ 90114673 A

(51) Int. Cl.[7] ................................................. H03L 7/00
(52) U.S. Cl. .......................... 331/107 SL; 331/107 DP
(58) Field of Search ........................... 331/100, 107 SL, 331/107 DP, 177 R, 181, 36 L

(56) References Cited

U.S. PATENT DOCUMENTS 4,157,517 A * 6/1979 Kneisel et al. .............. 333/205
5,291,162 A * 3/1994 Ito et al. ..................... 333/205
5,396,433 A * 3/1995 Kosugi ........................ 700/109

FOREIGN PATENT DOCUMENTS

JP          08065016 A * 3/1996 ............. H01P/7/08

* cited by examiner

Primary Examiner—Timothy P. Callahan
Assistant Examiner—Cassandra Cox
(74) Attorney, Agent, or Firm—Birch, Stewart, Kolasch & Birch, LLP

(57) ABSTRACT

The present invention provides a method for adjusting the frequency of an oscillator. The method comprises providing a substrate having a plurality of openings, forming a conductive layer on a first surface of the substrate and patterning the conductive layer to form a plurality of strip line, one of which is formed corresponding to the openings to become an inductance circuit, covering the conductive layer with a lid, and cutting part of the strip line through the plurality of openings from the opposite side of the first surface to adjust frequencies of the oscillator.

18 Claims, 2 Drawing Sheets

METHOD FOR ADJUSTING OSCILLATOR FREQUENCIES

BACKGROUND OF THE INVENTION

1. Field of the Invention

The present invention relates in general to a method for adjusting oscillator frequencies. In particular, the present invention relates to a method for adjusting frequencies of voltage-controlled oscillators.

2. Description of the Related Art

FIG. 1A shows layers 11~14 of a printed circuit board (PCB) of a conventional voltage-controlled oscillator (VCO). The first layer 11 is a conductive layer comprising circuit components, such as inductors, resistors, transistors and capacitors, connected with each other. There is an insulation layer 15 between every two conductive layers. Defective PCBs usually cause frequency fluctuations. A conventional method for adjusting the frequency of VCO is to cut the inductor 111 of the first layer 11 into a comb-like profile using laser beams from the top of the PCB as the diagram shown in FIG. 1B. The cuttings are performed on part numerated 1,2 and 3 to change the inductance and further rectify the frequency. After the rectification of the frequency, a metal lid 16 is applied, as shown in FIG. 1C, and the manufacturing process of the voltage-controlled oscillator is completed.

The manufacturing process described adjusts the frequency before the lid is applied. However, when the metal lid is applied, the amount of tin soldering the cover to the PCB and the metal lid itself will cause a change in the frequency. When the frequency is high, the variation is high, compromising the yield of final products.

SUMMARY OF THE INVENTION

An object of the present invention is to provide a method for adjusting the frequency of an oscillator. The method comprises providing a substrate having a plurality of openings, forming a first conductive layer on a first surface of the substrate and patterning the first conductive layer to form a plurality of strip lines, wherein one strip line is formed corresponding to the location of the openings to become an inductance circuit, covering the conductive layer with a lid, and cutting part of the strip line through the plurality of openings from the opposite side of the first surface to adjust frequencies of the oscillator.

According to the present invention, the one strip line has a plurality of hollow sections of any shape.

According to the present invention, the cutting process uses a laser beam to cut the strip line through the plurality of openings of the substrate to adjust the frequency of the electronic device. The cutting process comprises cutting the space between the plurality of hollow sections and the edge of the strip line. The space between the plurality of hollow sections and the edge of the strip line is adjustable. The cuttings are perpendicular to the edge of the strip line. The method of the present invention further comprises forming a plurality of another conductive layers between the first conductive layer described and the lid. An insulation layer is formed between the conductive layers, and between the substrate and the conductive layer. The insulation layers are fiberglass or epoxy resin glass and have a plurality of through holes filled with a conductive material to couple the circuit components of the plurality of conductive layers.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 1A:
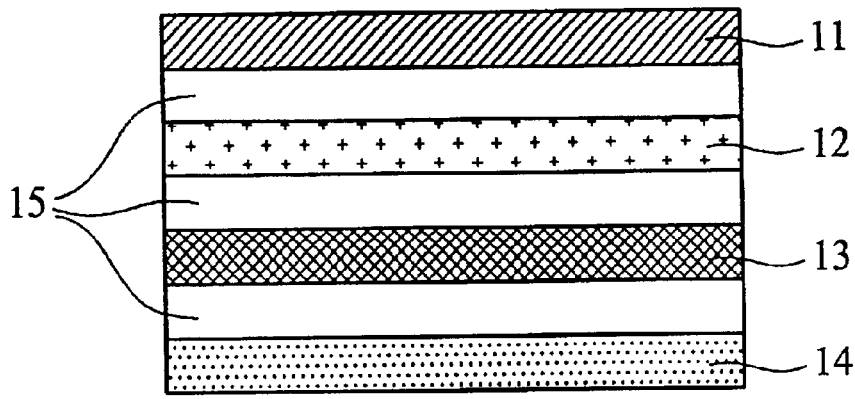
FIG. 1A shows layers of a printed circuit board (PCB) of a conventional voltage-controlled oscillator (VCO)
Figure 1B:
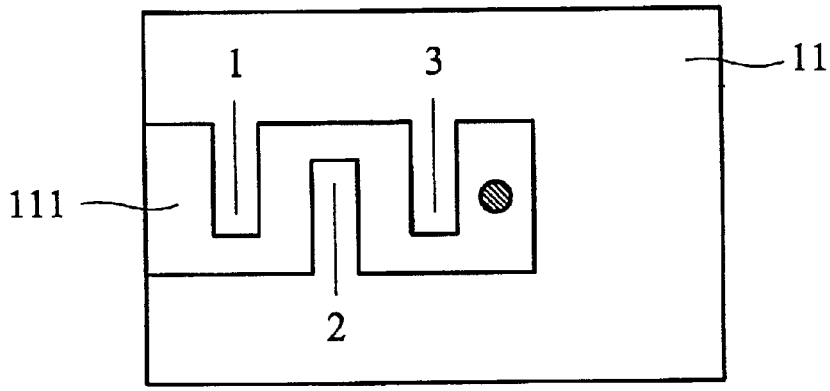
FIG. 1B shows the inductor of the first inductor layer cut to resemble a comb using laser beams from the top of the PCB in a conventional method.
Figure 1C:
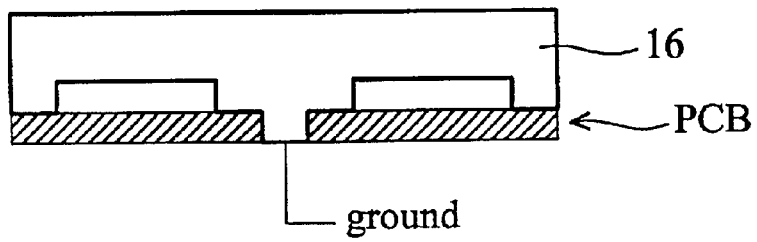
FIG. 1C shows a completed voltage-controlled oscillator with a metal lid applied.

The printed circuit board (PCB) of the voltage-controlled oscillator (VCO) of the present invention is shown in FIG. 1A. The inductance circuit is configured on the third layer. The number of the layers of the PCB can be adjusted according to practical evaluation. Here, the PCB of the present invention is comprised of 3 conductive layers 11, 12 and 13 formed on the substrate. The circuit components, such as resistors capacitors, diodes and transistors, of the first conductive layer 11 and the second conductive layer 12 are coupled together. The first conductive layer is patterned to form a plurality of microstrip lines and the second and third conductive layers are respectively patterned to form a plurality of strip lines so as to electrically connect the plurality of circuit components. The present invention uses patterned conductive foils as the microstrip lines and strip lines to provide the electric connections between the circuits on the conductive layers. An insulation layer 15 is formed between the conductive layers. The insulation layers can be formed by fiberglass (such as FR-4) or epoxy resin glass. The insulation layers have a plurality of through holes filled with a conductive material to electrically connect the circuit components on each of the conductive layers.

Figure 2A:
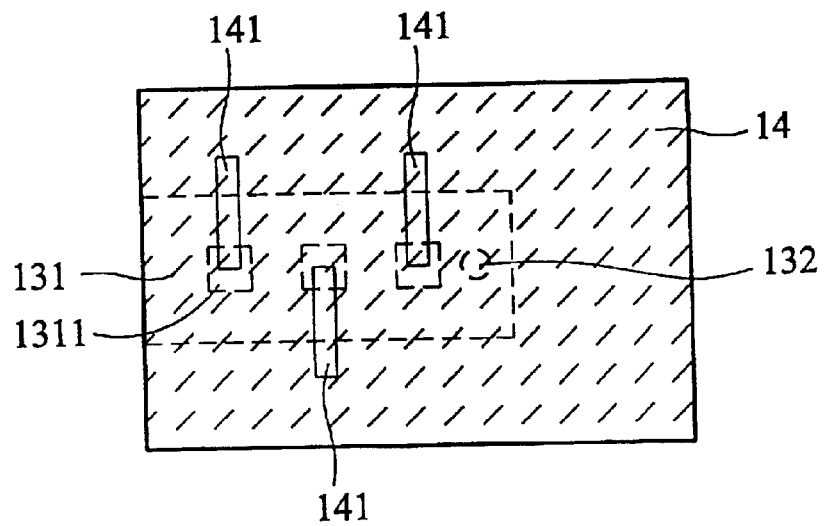
FIG. 2A shows an inductance circuit of the third conductive layer viewed from the bottom of the PCB of the oscillator of the present invention.

The conductive layers preferably comprise copper foil patterned to form a plurality of microstrip lines and strip lines to electrically connect circuit components on the conductive layers. The strip line used as the inductance circuit to adjust the frequency of the oscillator circuit is formed on the third conductive layer as the strip line 131 shown in FIG. 2A of the present invention. The strip line 131 is formed as a longitude strip with a plurality of hollow sections 1311 formed by optical etching, on top of the substrate corresponding to the plurality of openings 141 of the substrate. The strip line can be copper foil. The number and shape of the hollow sections are not limited to those shown in FIG. 2A. The hollow sections can be of the same or different sizes and shapes, depending on the desired oscillator frequency.

According to the present invention, the frequency is adjusted after the metal lid is applied on the PCB. The adjustment is performed from the bottom of the substrate by cutting the space between the plurality of hollow sections and the edge of the strip line 131 through the openings 141 with a laser beam, as numerations 21, 22, 23 in FIG. 2B.

Figure 2B:
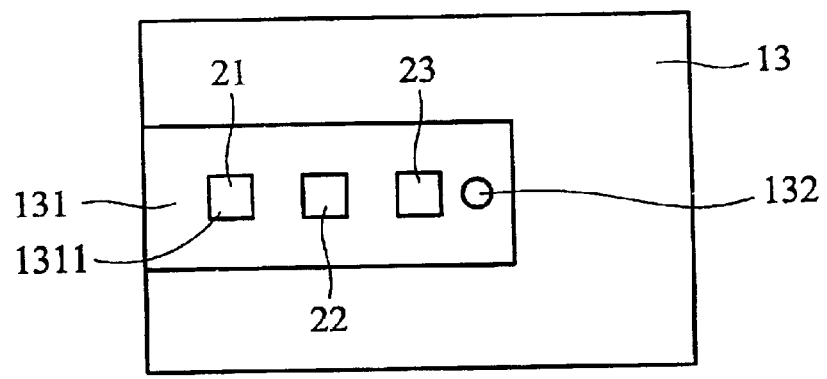
FIG. 2B shows a schematic diagram of the laser beam cutting the inductance circuit of the third conductive layer through the openings on the PCB substrate using a laser beam in the present invention.
Figure 2C:
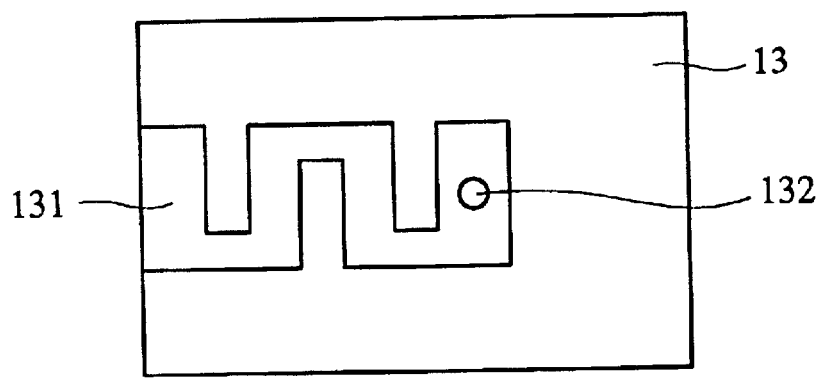
FIG. 2C shows the inductance circuit of the third conductive layer on the PCB of the present invention after cut by the laser beam.

After the cutting process is performed, the substrate is coated with a green paint to cover the mark cut and prevent short circuit. The strip line 131 can be cut alternately from the opposite sides of the space between the hollow sections and the edge of the strip line 131 as shown in FIG. 2B and FIG. 2C, or from the same side of the space between the hollow sections and the edge of the strip line 131. The space between the hollow sections and the edge of the strip line 131 is adjustable. The cuts can be perpendicular to the edge of the strip line. The strip line used as an inductor simulates a comb after the cuttings to increase the inductance and decrease the oscillation frequency. A wider control range of the frequency is obtained with more cuttings, and hence achieving the oscillator frequency control.

It is not necessary for the hollow sections to be formed. As described above, the cut is formed through the plurality of openings 141 on the substrate using a laser beam on the strip line of the inductance circuit to adjust the frequency of the oscillator.

Alternatively, the frequency of the oscillator is firstly adjusted into a predetermined range. After the metal lid is applied, the oscillator is then adjusted to the desired frequency by cutting the space between the hollow section and the edge of the microstrip line with a laser beam.

According to the present invention, the strip lines of inductance circuit of the PCB are formed in the third conductive layer and cut with a laser beam through the openings of the substrate after the metal lid is applied to adjust the frequency of the oscillator. Because the frequency of the oscillator is determined in a certain range after the metal lid is applied and adjusted to the desired value from the back of the PCB with a laser beam, the frequency of the oscillator is not affected by the coverage of the lid and the yield is increased.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for adjusting the frequency of an electronic device, the method comprising:
   providing a substrate having a plurality of openings;
   forming a first conductive layer on a first surface of the substrate and patterning the first conductive layer to form at least one strip line coupling a plurality of electronic components thereon, a strip line formed corresponding to the location of the openings to become an inductance circuit, the strip line having at least one hollow section;
   covering the first conductive layer with a lid; and
   cutting part of the strip line through the plurality of openings from a side of the substrate opposite to the first surface to adjust the frequency of the electronic device.

2. The method as claimed in claim 1, wherein the first conductive layer is a copper foil.

3. The method in claim 1, wherein the cutting process comprises cutting the strip line through the plurality of openings of the substrate using a laser beam to adjust the frequency of the electronic device.

4. The method in claim 3, wherein the cutting process comprises cutting the space between the hollow section and the edge of the strip line.

5. The method in claim 4, wherein the space between the hollow section and the edge of the strip line is adjustable.

6. The method in claim 4, wherein the cuttings are perpendicular to the edge of the strip line.

7. The method in claim 1 further comprising forming a plurality of another conductive layers between the first conductive layer and the lid, and an insulation layer between each two of the conductive layers.

8. The method in claim 7, wherein the plurality of another conductive layers are copper foil layers.

9. The method in claim 7, wherein the plurality of conductive layers have a plurality of circuit components coupled together.

10. The method in claim 7, wherein the insulation layer is material selected from a group consisting of fiberglass and epoxy resin glass.

11. The method in claim 7, wherein the insulation layer between each two of the conductive layers has a plurality of through holes filled with a conductive material to couple the circuit components of the plurality of conductive layers.

12. The method in claim 1, wherein the lid is a metal cover.

13. The method in claim 1, wherein the electronic device is an oscillator.

14. A method for adjusting the frequency of an oscillator, the method comprising:
   providing a substrate having a plurality of openings;
   forming a first conductive layer on a first surface of the substrate and patterning the first conductive layer to form a plurality of strip lines, one of which is formed corresponding to the location of the openings to become a inductance circuit;
   forming a second conductive layer on the first conductive layer and patterning the second conductive layer to form a plurality of microstrip lines coupling a plurality of electronic components thereon;
   covering the second conductive layer with a lid; and
   cutting one strip line through the plurality of openings from the opposite side of the first surface to adjust frequencies of the oscillator.

15. The method as claimed in claim 14, wherein the first and second conductive layers are made of copper foil, respectively.

16. The method as claimed in claim 14, wherein the strip line has a plurality of hollow sections.

17. The method in claim 14, wherein the cutting process comprises cutting the strip line through the plurality of openings of the substrate using a laser beam to adjust the frequency of the electronic device.

18. The method in claim 14, wherein the cutting process comprises cutting the space between the hollow section and the edge of the strip line.

* * * * *